US007307457B2

(12) United States Patent
Braceras et al.

(10) Patent No.: US 7,307,457 B2
(45) Date of Patent: Dec. 11, 2007

(54) APPARATUS FOR IMPLEMENTING DYNAMIC DATA PATH WITH INTERLOCKED KEEPER AND RESTORE DEVICES

(75) Inventors: George M. Braceras, Essex Junction, VT (US); John A. Fifield, Underhill, VT (US); Harold Pilo, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 12 days.

(21) Appl. No.: 11/278,169

(22) Filed: Mar. 31, 2006

(65) Prior Publication Data

US 2007/0229116 A1 Oct. 4, 2007

(51) Int. Cl.
*H03K 19/096* (2006.01)
*H03K 19/094* (2006.01)
*G11C 7/00* (2006.01)

(52) U.S. Cl. .................. 326/98; 326/95; 326/112; 326/119; 365/230.05; 365/154

(58) Field of Classification Search ............. 326/93, 326/65, 98, 112, 119, 121; 327/208–212, 327/214, 215, 224, 225; 365/230, 185.25
See application file for complete search history.

(56) References Cited

U.S. PATENT DOCUMENTS

| | | | | |
|---|---|---|---|---|
| 5,633,605 A | 5/1997 | Zimmerman et al. | ......... | 326/86 |
| 6,002,292 A | * 12/1999 | Allen et al. | .................. | 327/379 |
| 6,326,814 B1 | * 12/2001 | Stasiak et al. | ................ | 326/98 |
| 6,707,751 B2 | * 3/2004 | Iwahashi et al. | ....... | 365/230.05 |
| 6,794,901 B2 | * 9/2004 | Bernstein et al. | ............. | 326/95 |
| 6,795,368 B2 | * 9/2004 | Iwahashi et al. | ....... | 365/230.05 |
| 6,894,528 B2 | * 5/2005 | Gauthier et al. | ............. | 326/16 |
| 6,914,452 B2 | * 7/2005 | Gauthier et al. | ............. | 326/98 |
| 7,202,704 B2 | * 4/2007 | Chu et al. | ..................... | 326/98 |
| 7,227,766 B2 | * 6/2007 | Arsovski et al. | ............. | 365/49 |
| 2004/0051561 A1 | * 3/2004 | Gauthier et al. | ............. | 326/98 |
| 2004/0263208 A1 | * 12/2004 | Levy et al. | ................... | 326/98 |
| 2005/0052202 A1 | 3/2005 | Ngo | ............................ | 326/95 |
| 2005/0083082 A1 | 4/2005 | Olofsson | ..................... | 326/95 |
| 2005/0104612 A1 | 5/2005 | Hsu et al. | ................... | 324/763 |
| 2006/0001442 A1 | 1/2006 | Wood et al. | .................. | 326/9 |

* cited by examiner

*Primary Examiner*—Vibol Tan
*Assistant Examiner*—Dylan White
(74) *Attorney, Agent, or Firm*—Cantor Colburn LLP; Michael LeStrange (57) ABSTRACT

A keeper device for dynamic logic includes a first keeper path statically coupled to a dynamic data path, the first keeper path configured to prevent false discharge of the dynamic data path during an evaluation thereof, and a second keeper path selectively coupled to the dynamic data path. The second keeper path is configured to maintain the dynamic data path at a nominal precharge level prior to an evaluation thereof, wherein the second keeper path is decoupled from the dynamic data path during the evaluation.

6 Claims, 8 Drawing Sheets

APPARATUS FOR IMPLEMENTING DYNAMIC DATA PATH WITH INTERLOCKED KEEPER AND RESTORE DEVICES

BACKGROUND

The present invention relates generally to dynamic data paths and, more particularly, to an apparatus for implementing dynamic data paths with interlocked keeper and restore devices.

Dynamic logic is one type of circuit design approach that is used to increase digital circuit speed, as compared to static complementary metal oxide semiconductor (CMOS) logic, for example. A CMOS gate is a fully complementary logic gate using both p-type and n-type devices configured to implement a desired logic function (e.g., a simple inverter). Static CMOS logic gates require large fan-in, which in turn causes large gate input capacitances that slow down the logic circuit. Furthermore, static logic gates use relatively slow p-type metal oxide semiconductor (PMOS) devices to implement a pull-up network, which further increases the capacitance of the gate input and slows rise times.

In dynamic logic circuits, a PMOS pull-up network is replaced by a single clocked PMOS transistor. Each clock cycle is divided into two phases, a "precharge" phase and an "evaluate" phase. During the precharge phase, an output node is unconditionally precharged to a high logic state. Then, during the evaluate phase, the output node either remains high or is conditionally discharged to low, depending on the current logic output level. The logic function is implemented by a network of n-type pull down transistors, which are controlled by their respective gate inputs in order to either maintain or discharge the voltage at the output node.

A transition period corresponds to the time between when the node is precharged and when the input signal is evaluated. During this time, the node may not be driven by any component but is instead "floating." As a result, the node is susceptible to leakage paths through the pull down devices, which could result in an erroneous evaluation of the input signal during the subsequent evaluation period. Thus, one existing approach to preventing false evaluations is the use of a "keeper" circuit that utilizes a pull-up transistor to maintain the precharge node at a desired logic level during the transition period. In this approach, the pull-up PMOS transistor of the keeper is coupled between the supply voltage source and the precharged node, with the gate of the transistor being coupled to the inverted node voltage. When the precharge node is precharged high, the inverter provides a logic low signal to render the keeper PMOS transistor conductive and thus maintain the precharge node high even after the precharge phase is complete.

Unfortunately, the increased leakage current associated with scaled technologies has forced designers to increase the size of the keeper devices in dynamic circuits to maintain nodes at the precharge state. In addition, the evaluation stacks must be made with longer device lengths or higher voltage thresholds to substantially reduce the leakage. Conversely, if the keeper is too strong, the pull down devices will have greater difficulty pulling down the output node during an evaluation phase. As such, the resulting slower performance of dynamic circuit topologies (as compared to static circuits) would arguably no longer justify the implementation of the dynamic logic. Further, self-resetting techniques typically employed for dynamic data paths are becoming very difficult to control because of the larger device variations and poor control of the evaluation and precharge periods. Accordingly, it would be desirable to be able to provide an improved dynamic data path that maintains acceptable levels of robustness.

SUMMARY

The foregoing discussed drawbacks and deficiencies of the prior art are overcome or alleviated by a keeper device for dynamic logic, including a first keeper path statically coupled to a dynamic data path, the first keeper path configured to prevent false discharge of the dynamic data path during an evaluation thereof, and a second keeper path selectively coupled to the dynamic data path. The second keeper path is configured to maintain the dynamic data path at a nominal precharge level prior to an evaluation thereof, wherein the second keeper path is decoupled from the dynamic data path during the evaluation.

In another embodiment, a memory device includes a dynamic evaluation circuit coupled to data outputs of each of a plurality of memory subarrays, and a keeper device having a first keeper path statically coupled to a dynamic data path associated with the dynamic evaluation circuit, the first keeper path configured to prevent false discharge of the dynamic data path during an evaluation thereof. The keeper device also has a second keeper path selectively coupled to the dynamic data path, the second keeper path configured to maintain the dynamic data path at a nominal precharge level prior to an evaluation thereof. The second keeper path is decoupled from the dynamic data path during the evaluation.

BRIEF DESCRIPTION OF THE DRAWINGS

Referring to the exemplary drawings wherein like elements are numbered alike in the several Figures:

FIGS. 2(*a*) through 2(*c*) are waveform timing diagrams illustrating the performance of the dynamic data path of FIG. 1, under various process and operating conditions;

FIGS. 4(*a*) through 4(*c*) are waveform timing diagrams illustrating the performance of the inventive dynamic data path of FIG. 3, under various process and operating conditions.

DETAILED DESCRIPTION

Figure 1:
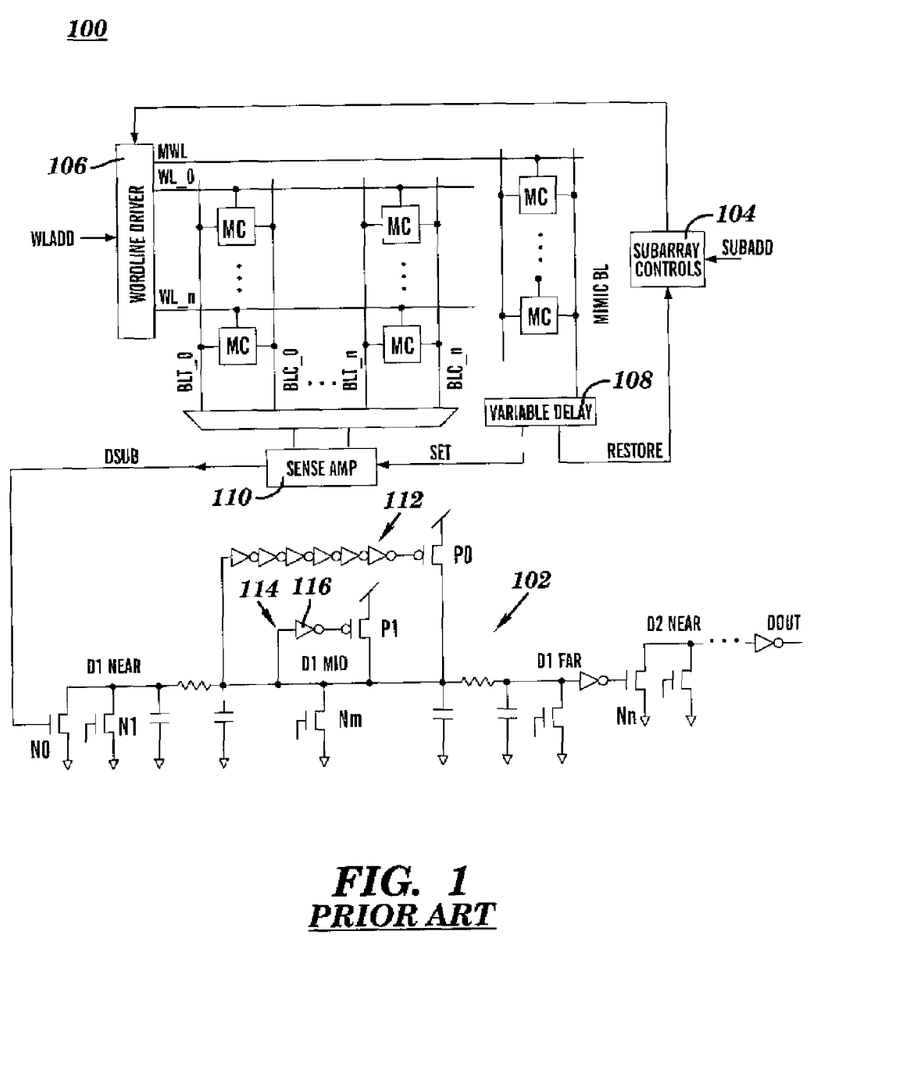
FIG. 1 is a schematic diagram of a computer memory subarray having a dynamic data path configured with conventional restore and keeper circuitry.

Referring initially to FIG. 1, there is shown a schematic diagram of a computer memory subarray 100 having a dynamic data path 102 configured with conventional restore and keeper circuitry. In the example illustrated, the subarray includes a subarray control block 104, a local wordline driver 106, and an array of memory cells MC (such as SRAM cells for example) each coupled one of a plurality of wordlines WL_0 through WL_n, and a pair of true/complement bitlines BLT_0/BLC_0 through BLT_n/BLC_n. The memory subarray 100 also includes a mimic path (i.e., mimic wordline MWL, dummy memory cells and mimic bit lines) for generating sense amplifier SET timing signals and restore timing signals for the subarray controls 104 through a variable delay block 108. The restore timing of the subarray 100 is independent of the restore timing of the wordline addresses (WLADD) and subarray addresses (SUBADD), and is locally generated by the "RESTORE" signal after a sense amplifier 110 is set. The sense amplifier 110 latches data from a selected one of the memory cells MC of the subarray 100. This sensed data (DSUB) from the subarray 100 is self-resetting and drives a dynamic OR configuration.

More specifically, the dynamic OR configuration includes a series of pull down NFET transistors N0 through Nn, wherein each NFET corresponds to the sensed data of a different subarray (only one subarray being shown in FIG. 1). As data from several subarrays are coupled to the dynamic OR configuration and thus the data path 102, the series resistance and capacitance of the path is also schematically depicted in FIG. 1. In addition, specific locations along the data path are also designated: D1 NEAR, D1 MID, D1 FAR. FIG. 1 further illustrates a second (or more) data path stage D2 NEAR, etc. coupled to the inverted output of the first stage prior to the output signal DOUT.

In order to precharge and restore the data path 102 to a logic high level, a delay chain 112 is used. The delay chain 112 includes an even numbered configuration of inverter stages, the output of which is coupled to a pull up PFET P0. Thus, when the data path 102 is pulled low by one of the pull down NFETs during an evaluation phase, the corresponding low output of the inverter stages will subsequently cause P0 to restore the data path back to a logic high voltage value once the signal propagates through the delay chain. The number of inverter stages is selected so as to provide sufficient delay for a pull down of the data path 102 to be registered before being restored to $V_{DD}$.

As stated previously, the leakage current ($I_{off}$) associated with each of the NFET pull down paths could be sufficient to cause a false evaluation. Thus, a keeper device 114 is also provided to maintain the data path 102 at a sufficiently high level during a transition period. In the conventional keeper configuration of FIG. 1, an inverter 116 (having the input thereof coupled to the data path 102) drives a single PFET P1. However, in order for the keeper device 114 to properly function as intended, at least two key requirements must be met. First, the on current ($I_{on}$) of the PFET keeper transistor P1 with a weak PFET process corner must be greater than the sum of all the NFET $I_{off}$ paths for a strong NFET process corner. Conversely, the selected (evaluate) NFET must be able to overcome the $I_{on}$ of the keeper PFET P0 in a weak-NFET, strong-PFET corner. The challenges of making this topology workable are further illustrated in the waveform diagrams of FIGS. 2(a) through 2(c).

Figure 2A:
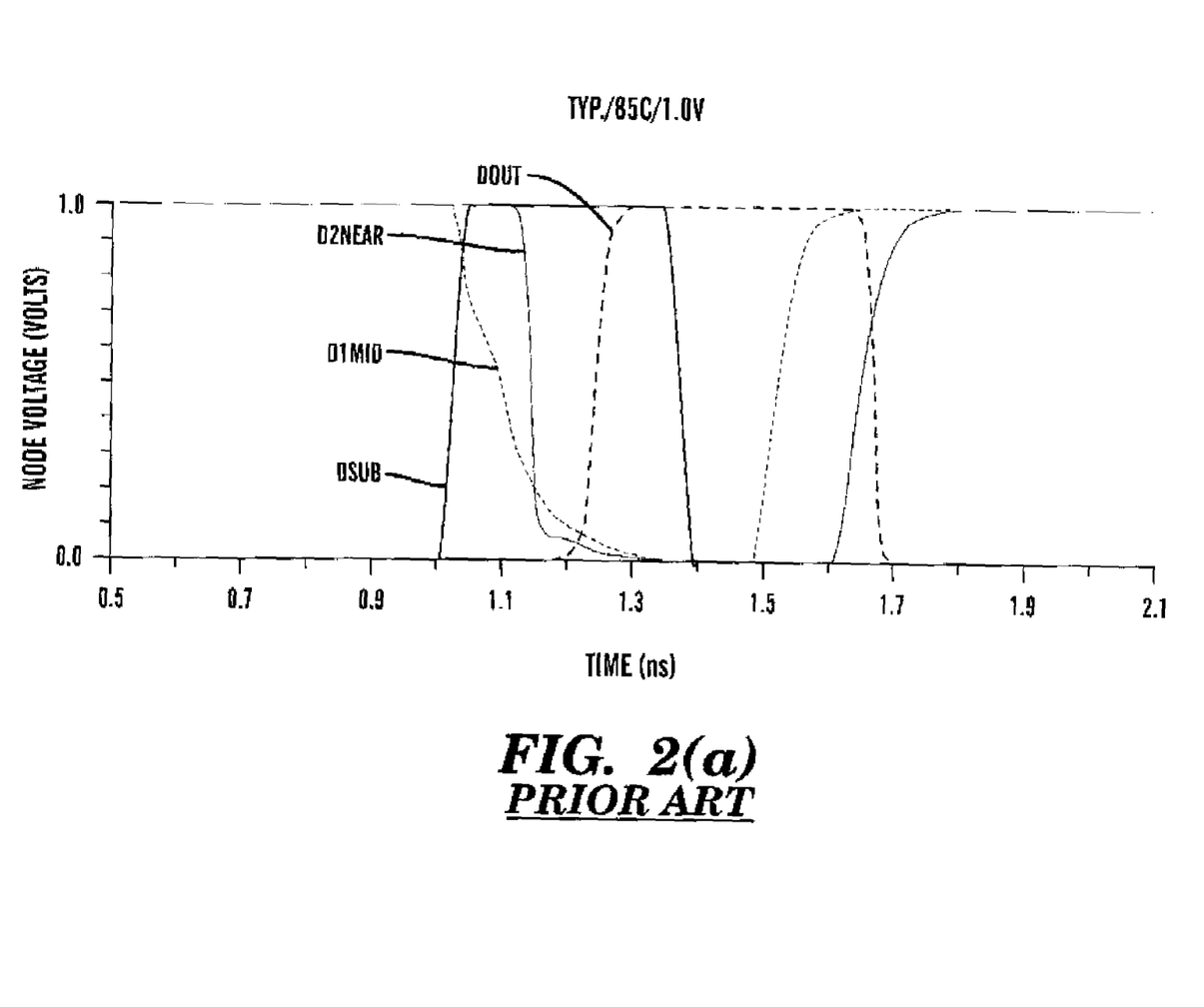
Figure 2B:
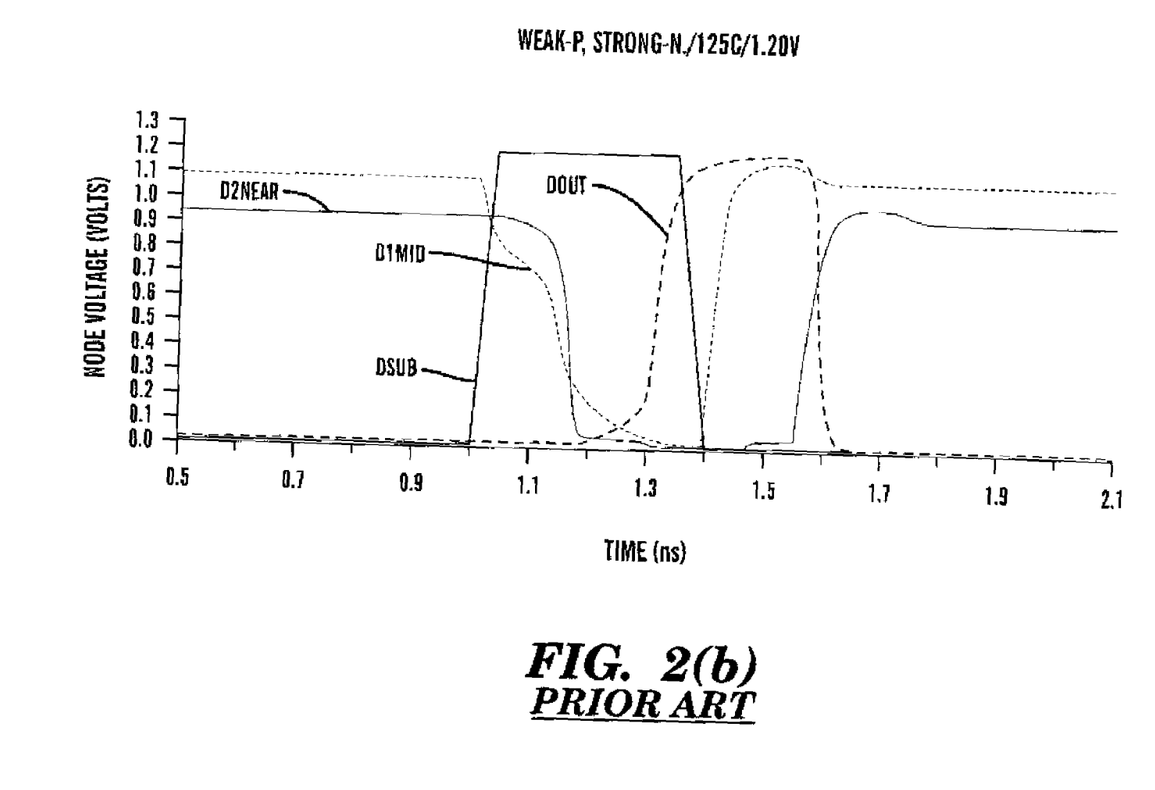
Figure 2C:
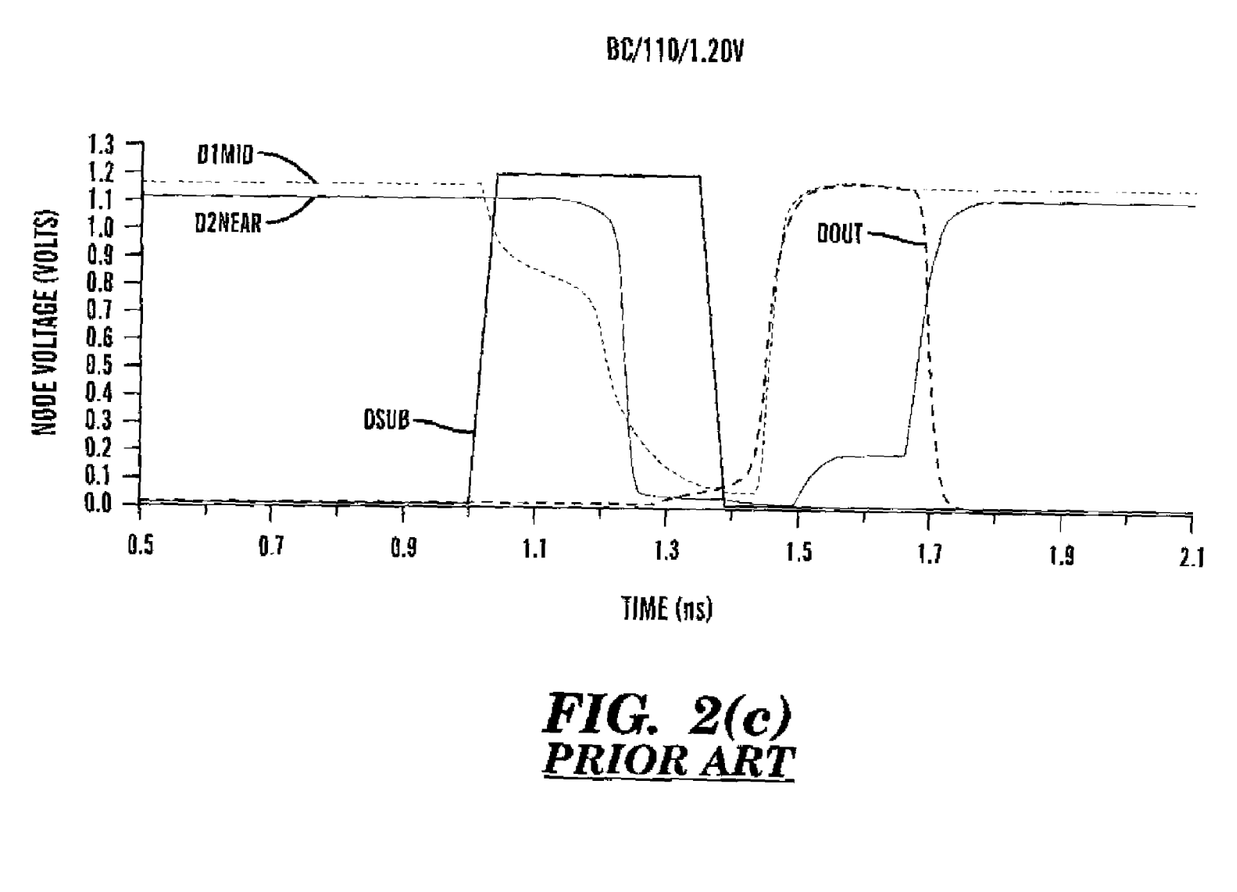

The waveform diagrams of FIGS. 2(a) through 2(c) depict a simulation, in 65 nm SOI (silicon on insulator) technology, of various node voltages of an eight-input NFET dynamic OR scheme (i.e., eight subarrays sharing the same data-bus). In particular, there are three cases illustrated: a nominal fabrication/operating condition case in FIG. 2(a), a weak PFET/strong NFET fabrication at elevated operating temperature and higher $V_{DD}$ voltage in FIG. 2(b); and a "best case" fabrication at a more slightly elevated operating temperature and higher $V_{DD}$ voltage in FIG. 2(c). The curves depict the various node voltages shown in FIG. 1, including DSUB (the data from the subarray), which drives the two stages of the data-bus 102, D1 MID and D2 NEAR. The curve for the voltage at the final output DOUT is also shown. Of particular interest in the simulation curves is the voltage at D1 MID, which reflects the performance of the dynamic data path during an evaluate condition.

Referring first to FIG. 2(a), the simulation therein illustrates the slope change of the voltage at node D1 MID as the evaluate device attempts to overcome the pull up action keeper device. As is shown, there is only a slight "kink" in the degradation of the D1 MID node from logic high to logic low. Thus, under "nominal" device processing results and operating conditions (e.g., 85° C., 1.0 volts), the performance of the dynamic data path with conventional keeper and precharge circuitry is, for the most part, acceptable. However, as shown in FIG. 2(b), the results are quite different under non-ideal device characteristics and operating conditions. First, it will be noted that as a result of the keeper PFET being relatively weak with respect to the leakage of the NFETs, the voltage value maintained at D1 MID (about 1.1 volts) is slightly less than the nominal value of $V_{DD}$ (1.2 volts). This becomes more pronounced at the second stage of the data path, as the precharge voltage at D2 NEAR is further decreased to about 0.9 volts. In addition, due the elevated operating temperature of the device, a more pronounced kink is seen in the discharging D1 MID node, which result in a slightly slower performance than in the nominal case of FIG. 2(a).

In FIG. 2(c), the keeper strength is now relatively high, and so the precharge levels of D1 MID and D2 NEAR are better than in FIG. 2(b), although still not quite at the nominal 1.2 volt value of $V_{DD}$. However, because the keeper device is strong in this instance, the time taken for D1 MID to discharge is visibly longer. This reflects the difficulty of the dynamic NFETs in overcoming the pull of keeper device. It will thus be realized from FIGS. 2(a) through 2(c) that the conventional keeper scheme is not robust at scaled technologies, due to the effect that variations in device dimensions or operating conditions have on performance.

Figure 3:
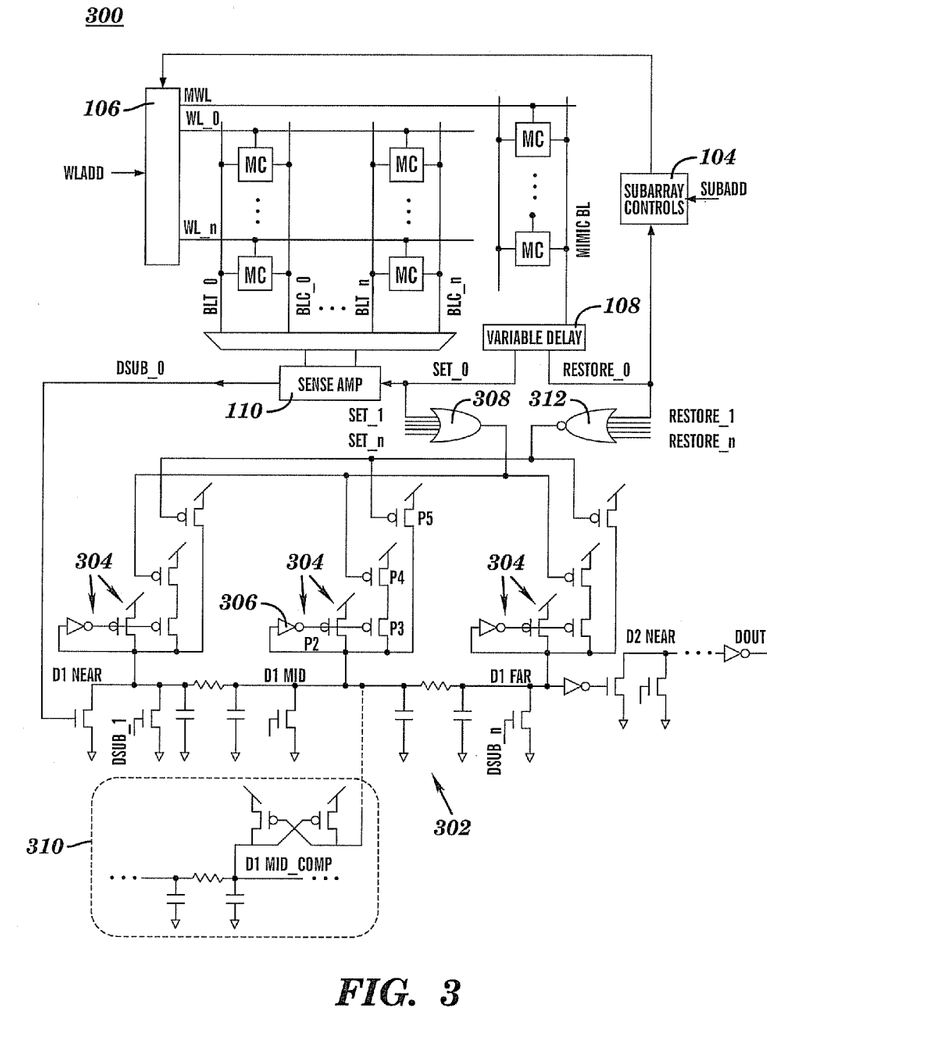
FIG. 3 is a schematic diagram of a computer memory subarray having a dynamic data path configured with interlocked restore and keeper devices, in accordance with an embodiment of the invention.

Therefore, in accordance with an embodiment of the invention, FIG. 3 is a schematic diagram of a computer memory subarray 300 having a dynamic data path 302 configured with interlocked restore and keeper devices. Moreover, the present keeper scheme employs a hybrid keeper topology that utilizes a first (weak) non-gated keeper path and a second (strong) gated keeper path. The strong, gated keeper is disabled prior to the arrival of data using a subarray interlock such that the evaluate pull down path no longer has to overcome a strong keeper device, thereby achieving a performance gain. In addition, the restore operation of the data path in the present embodiment is implemented from the restore signal of the local subarray. This eliminates self-resetting timing variations across the data path, and is particularly helpful in maintaining well controlled data pulse widths across several cascoded data path stages.

As more specifically shown in FIG. 3, the memory array portion of the subarray 300 is substantially the same as shown in FIG. 1. Thus, similar elements are designated using the same reference numerals for purposes of clarity. As will first be noted, the conventional inverter/single PFET keeper device of FIG. 1 is now replaced with a dual path keeper device 304. Although the keeper device 304 is shown repeated at various locations along the dynamic data path 302 (e.g., at D1 NEAR, D1 MID, D1 FAR) to provide improved precharge timing and levels across the wire, only one instance thereof is described. A first keeper path includes inverter 306 and weak PFET P2. As this path is not gated (i.e., not selectively enabled), PFET P2 will still prevent a false evaluation during an evaluation stage. Because the strength of P2 is relatively weak with respect to the leakage of the evaluate NFETs, it will not cause performance issues by strongly opposing a pull down of the output node during an evaluation stage.

Moreover, the problem associated with weak keeper PFETs (i.e., the inability to maintain the node at the proper precharge level following a restore operation and prior to an evaluate operation) is overcome, since a second (strong) keeper path is also enabled during this time. The second keeper path includes inverter 306 and PFET P3 in series with gated PFET P4. When enabled, the resulting pull up strength of the combination of P3 and P4 is greater than the pull up strength of P2, and may be (for example) on the order of about 10 times as strong.

As further illustrated in FIG. 3, the gated PFET P4 of the keeper device 304 is triggered by the output of a static OR gate 308 that receives the SET signals sent to the sense amplifiers in each of the subarrays utilizing the data path 302. Thus, the strong keeper path is interlocked through and deselected with the SET signals provided to the respective sense amplifiers. Because the arrival of the SET signal precedes the arrival of data on a DSUB data line, the pull down NFETs of the dynamic evaluate device are not opposed by the strong, gated keeper path. In other words, the dynamic evaluate device need only overcome the weak keeper PFET P2. Again, the weak keeper PFET P2 prevents an unselected data path from significantly discharging during the brief period that a SET signal disables the strong keeper path. In addition, a cross-coupled PFET pair may also be used to prevent discharge of unselected data path as shown in the dashed portion 310 of FIG. 3, which would utilize a complementary data path topology. Another advantage of the interlocking of the strong keeper path with the SET signal is that by preventing the disabling of the strong keeper device until the SET signal is generated, the data path is prevented from being prematurely evaluated.

As also discussed above, the conventional restore circuit 112 of FIG. 1 is replaced by pull up PFETs P5 that are interlocked with the RESTORE signals of the subarrays. In this manner, any mistrack in data bus pulse widths with respect to subarray restore timings is eliminated. In the embodiment of FIG. 3, the RESTORE signals of the subarrays are each fed into a static NOR gate 312, the output of which is connected to the gate(s) of the restore PFET(s) P5. As is the case with the dual path keeper device 304, the restore device may also be repeated along various locations of the data path 302 to improve precharge performance and timing.

Figure 4A:
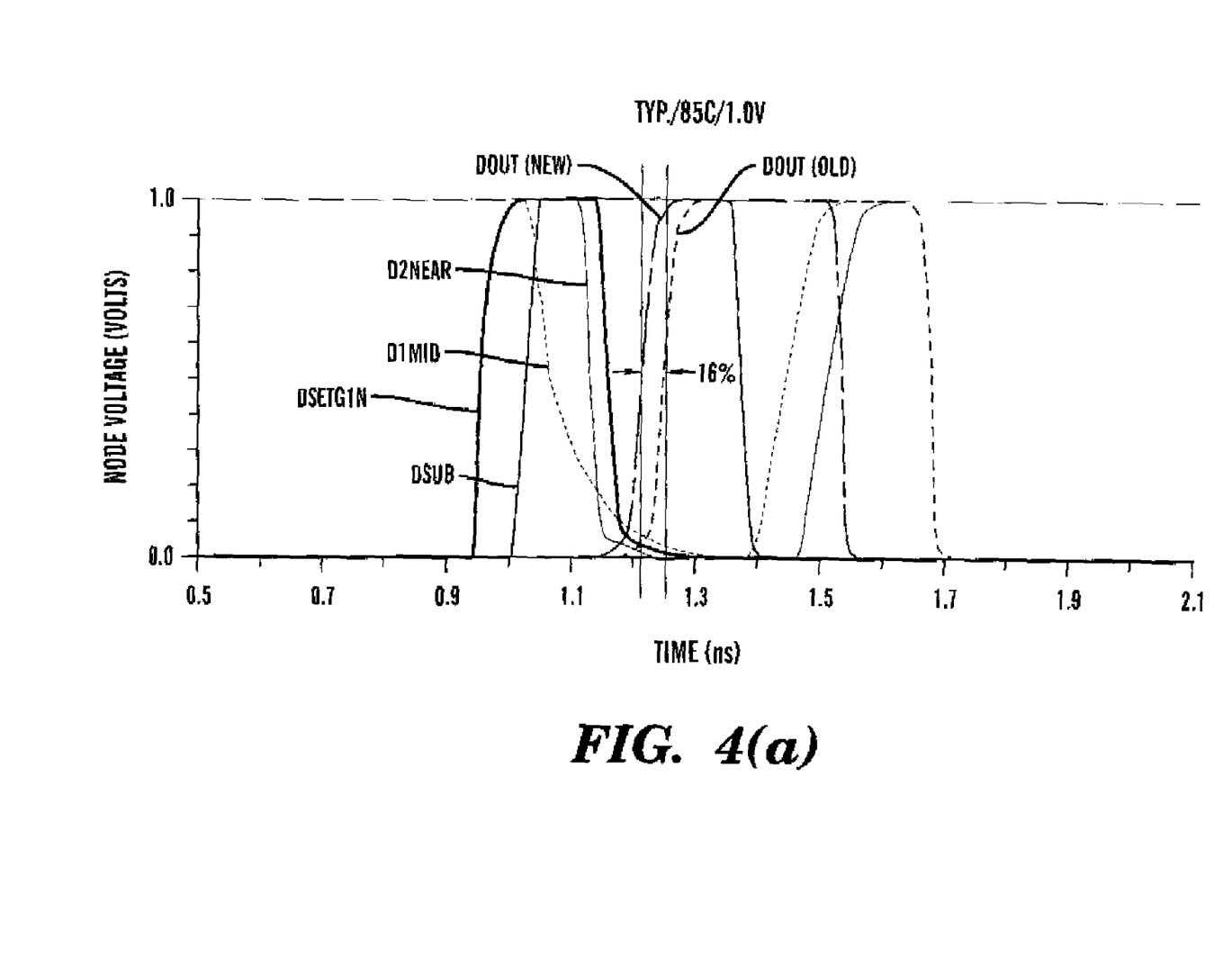
Figure 4B:
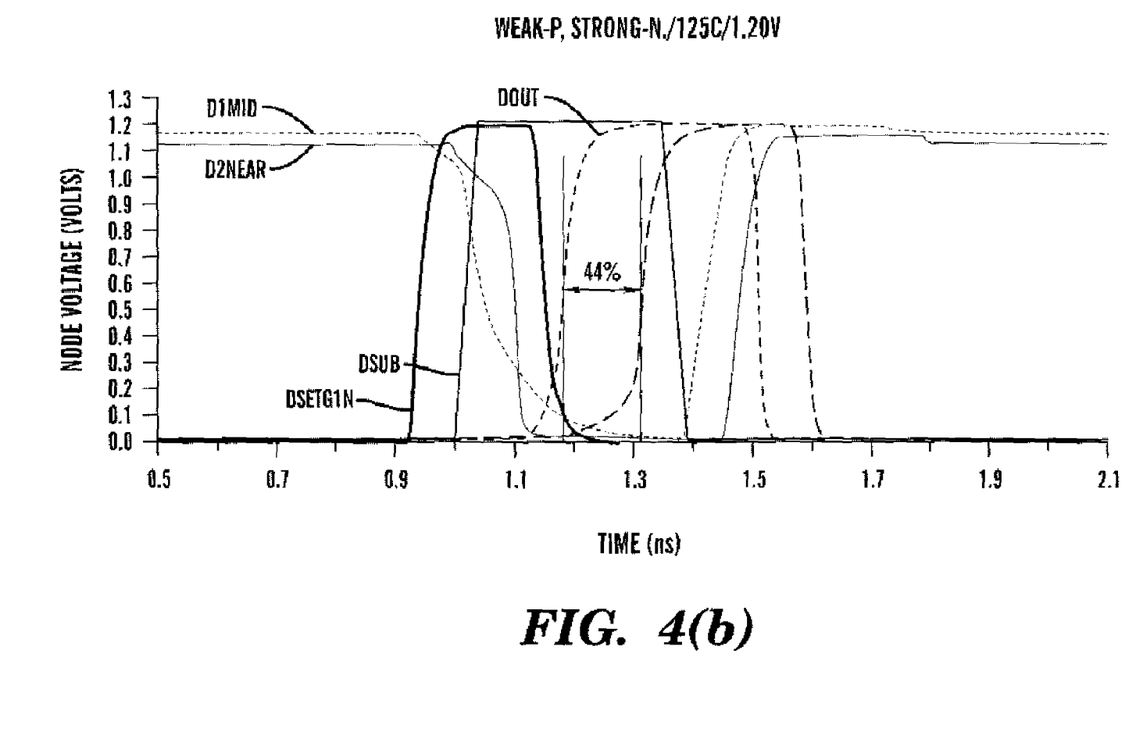
Figure 4C:
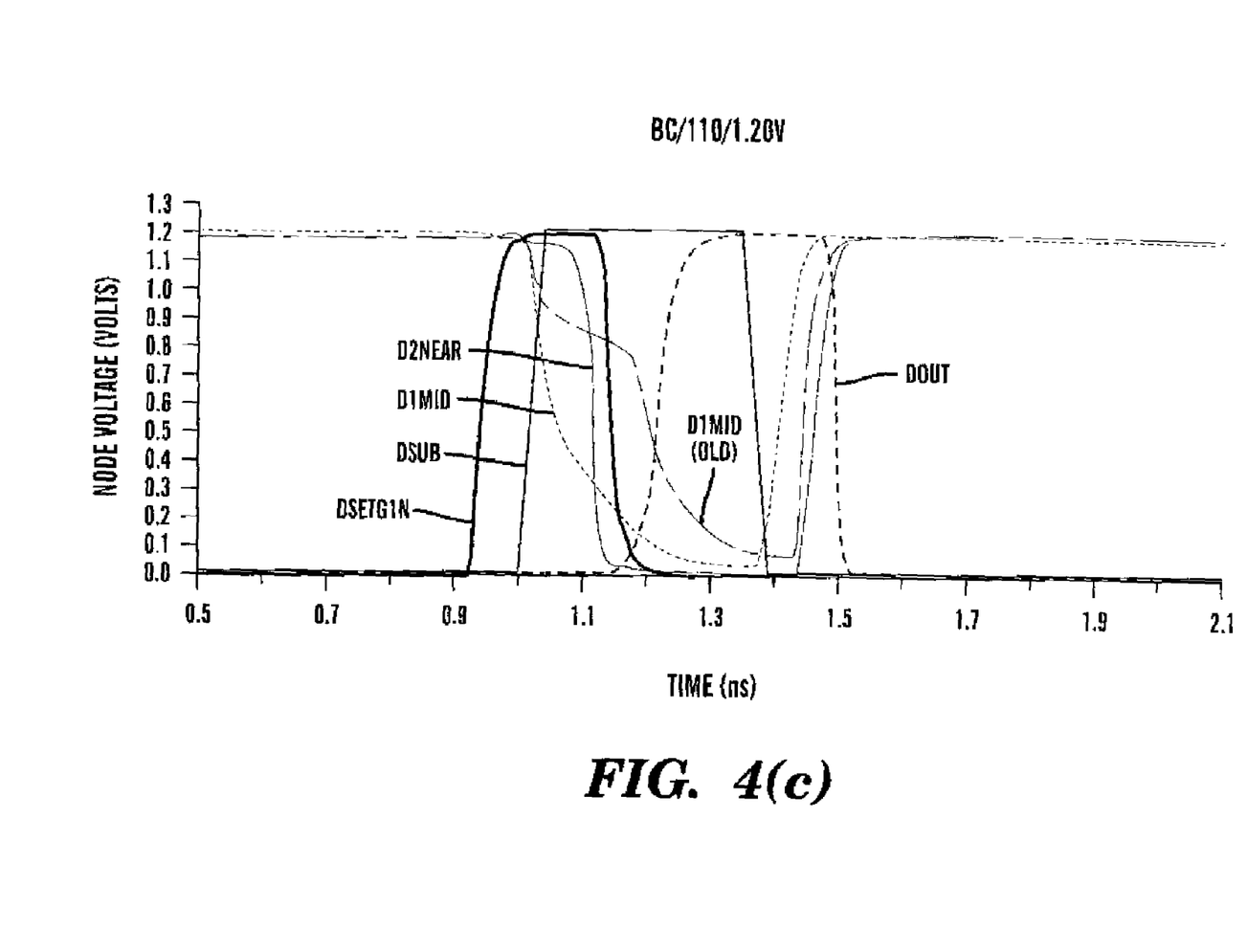

Finally, FIGS. 4(a) through 4(c) are waveform timing diagrams illustrating the improved performance of the inventive dynamic data path of FIG. 3, under various process and operating conditions. In FIG. 4(a), the waveforms of the various nodes under nominal process and operating conditions demonstrate a performance improvement of about 16% with respect to the conventional keeper device. In other words, the registration of the output signal on DOUT is quicker with the present keeper topology. It will also be noted that the decaying voltage on the data path (node D1 MID) is much smoother than for the conventional device of FIG. 1.

As illustrated in FIG. 4(b), the performance improvement is even more significant (about a 44% timing improvement) over a conventional device having a weak keeper PFET. In addition, where the NFETs of the present configuration are formed relatively strong with respect to the weak keeper path, they do not have the same adverse impact on the precharged voltage level as in the case of FIG. 2(b), due to the activated strong keeper path prior to SET activation. In FIG. 4(c), the decay of the node voltage at D1 MID signal is shown for both the present embodiment of FIG. 3 and the conventional device of FIG. 1 (old) to illustrate the improvements in performance and signal integrity. Whereas D1 MID (old) exhibits a significant kink, the waveform D1 MID demonstrates a smooth, rapid decay.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A memory device, comprising:
    a dynamic evaluation circuit coupled to data outputs of each of a plurality of memory subarrays;
    a keeper device having a first keeper path statically coupled to a dynamic data path associated with said dynamic evaluation circuit, said first keeper path configured to prevent false discharge of the dynamic data path during an evaluation thereof, said first keeper path being relatively weak with respect to the pull down strength of said dynamic evaluation circuit associated with said dynamic data path;
    said first keeper path having an inverter having an input thereof coupled to the dynamic data path, and a weak pull up PFET coupled between a voltage supply rail and the dynamic data path, with a gate thereof controlled by an output of said inverter; and
    said keeper device also having a second keeper path selectively coupled to said dynamic data path, said second keeper path configured to maintain said dynamic data path at a nominal precharge level prior to an evaluation thereof, said second keeper path being relatively strong with respect to a leakage path of said dynamic evaluation circuit;
    said second keeper path further comprising a pair of series connected PFETs, a first of said pair coupled to the dynamic data path with a gate thereof connected to said output of said inverter, a second of said pair coupled between said first of said pair and said voltage supply rail, with a gate thereof controlled by a gated signal, wherein said pair of series connected PFETs comprises a strong pull up device with respect to said weak pull up PFET of said first keeper path, and wherein said gated signal is configured to decouple said second keeper path from the dynamic data path prior to said evaluation; and
    a first static logic gate configured to receive sense amplifier set signals of said plurality of memory subarrays, wherein said gated signal is generated by an output of said static logic gate.

2. The memory device of claim 1, wherein said second keeper path is about ten times stronger with respect to said first keeper path.

3. The memory device of claim 1, wherein said first static logic gate comprises an OR gate.

4. The memory device of claim 1, further comprising a gated restore circuit coupled to said dynamic data path, said restore circuit configured to precharge said dynamic data path during a restore operation.

5. The memory device of claim 1, wherein said gated restore circuit further comprises one or more pull up PFETs coupled to an output of a dynamic NOR gate, said dynamic NOR gate configured to receive restore signals of said plurality of memory subarrays.

6. The memory device of claim 1, further comprising a plurality of keeper devices located along selected points of said dynamic data path, each of said plurality of keeper devices having said first and second keeper paths.

* * * * *